United States Patent
Faue

(10) Patent No.: US 7,764,565 B2
(45) Date of Patent: Jul. 27, 2010

(54) MULTI-BANK BLOCK ARCHITECTURE FOR INTEGRATED CIRCUIT MEMORY DEVICES HAVING NON-SHARED SENSE AMPLIFIER BANDS BETWEEN BANKS

(75) Inventor: Jon Allan Faue, Colorado Springs, CO (US)

(73) Assignee: ProMOS Technologies PTE.Ltd., Singapore (SG)

( * ) Notice: Subject to any disclaimer, the term of this patent is extended or adjusted under 35 U.S.C. 154(b) by 235 days.

(21) Appl. No.: 12/049,244

(22) Filed: Mar. 14, 2008

(65) Prior Publication Data

US 2009/0231944 A1 Sep. 17, 2009

(51) Int. Cl.
*G11C 8/00* (2006.01)

(52) U.S. Cl. ............... 365/230.03; 365/63; 365/189.03; 365/205

(58) Field of Classification Search ............. 365/63, 365/205, 230.03
See application file for complete search history.

(56) References Cited

U.S. PATENT DOCUMENTS

| | | | |
|---|---|---|---|
| 6,327,214 B1* | 12/2001 | Yoon et al. | 365/230.03 |
| 2002/0051401 A1* | 5/2002 | Lee | 365/230.03 |
| 2004/0004900 A1* | 1/2004 | Dosaka | 365/230.06 |
| 2004/0141369 A1* | 7/2004 | Noguchi | 365/158 |
| 2008/0239847 A1* | 10/2008 | Jung et al. | 365/203 |
| 2009/0161401 A1* | 6/2009 | Bilger et al. | 365/51 |

* cited by examiner

*Primary Examiner*—Hoai V Ho
(74) *Attorney, Agent, or Firm*—William J. Kubida; Peter J. Meza; Hogan Lovells US LLP

(57) ABSTRACT

A multi-bank block architecture for integrated circuit memory devices which effectively reduces the total length of the datapath for a given input/output (I/O) from the memory cells in the memory array to the actual device I/O pad. In accordance with the present, a memory block in a memory device is effectively divided into two or more banks, and between these banks an additional non-shared sense amplifier band is added as a sense amplifier cannot be shared across a bank boundary. Within this multi-bank block, separate data paths are provided for the banks with the column (Y-Select) lines being common.

19 Claims, 3 Drawing Sheets

NON-SHARED SENSE AMPLIFIER INSERTION POINTS

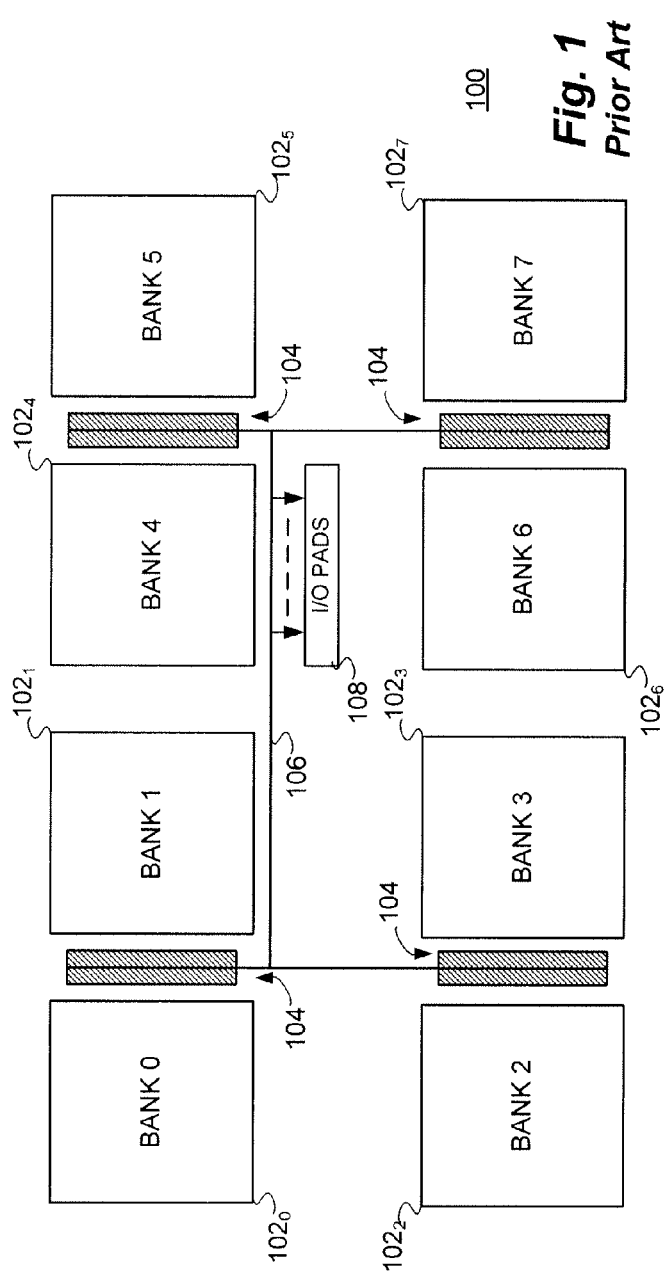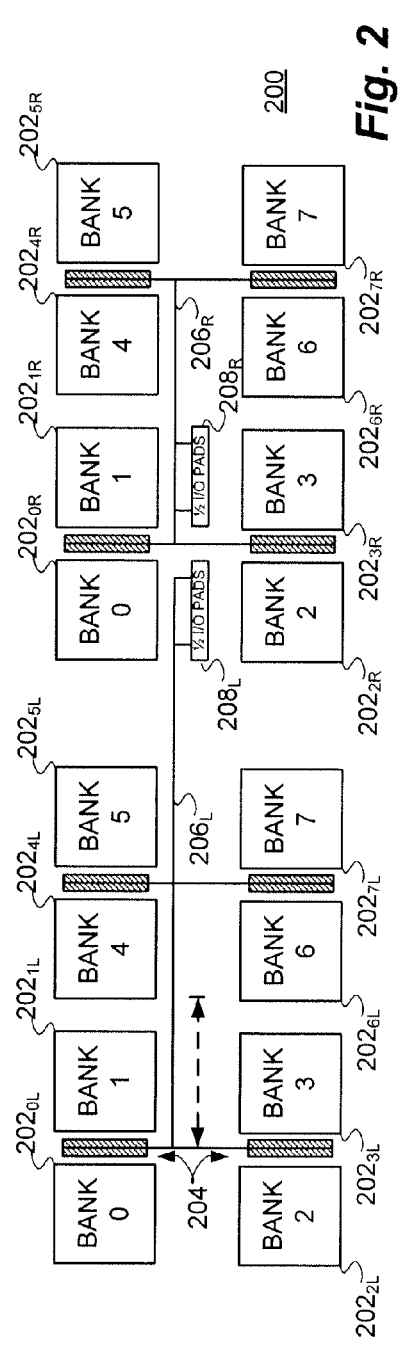
Fig. 1
Prior Art
Fig. 2
Prior Art

MULTI-BANK BLOCK ARCHITECTURE FOR INTEGRATED CIRCUIT MEMORY DEVICES HAVING NON-SHARED SENSE AMPLIFIER BANDS BETWEEN BANKS

BACKGROUND OF THE INVENTION

The present invention relates, in general, to the field of integrated circuit memory devices. More particularly, the present invention relates to a multi-bank block architecture for integrated circuit memory devices having non-shared sense amplifier bands between banks.

Synchronous Dynamic Random Access Memory (SDRAM) memory devices provide enhanced performance over their asynchronous predecessors and generally enable improved read/write access time through the interleaving of data across multiple memory cell blocks such that one block may be accessed while another is being refreshed. Follow-on Double Data Rate (DDR) SDRAM effectively doubles data transfer rates by transferring data on both the rising and falling edges of the device clock.

In Double Data Rate Two (DDR2) devices, the external data bus is clocked at twice the speed of the memory cells enabling four words of data to be transferred per memory cell cycle. Therefore, without speeding up the operation of the memory cells themselves, DDR2 devices can effectively operate at twice the bus speed of DDR memories. In comparison, Double Data Rate Three (DDR3) devices enable their input/output (I/O) bus to run at four times the speed of the memory cells while providing lower power consumption, higher bandwidth but greater latency than comparable DDR2 memory devices.

Current DDR3 memory devices have eight banks of memory and the package pinout places all of the I/O pads to one side of the chip/package. Since each I/O path must reach all eight of these banks, some of these paths are relatively long while others are comparatively short. These disparate signal path lengths lead to difficult timing issues. A conventional approach directed towards ameliorating this problem is to place 'half banks' on each side of device chip so that I/O paths on the left and right sides of the device are not shared. However, this approach then doubles the number of column decoders required and places some of these column decodes farther away from the I/O pads.

SUMMARY OF THE INVENTION

The present invention advantageously provides a multi-bank block architecture for integrated circuit memory devices which effectively reduces the total length of the datapath for a given I/O from the memory cells in the memory array to the actual device I/O pad.

As used herein, the following definitions will pertain:

Bank:—A group of memory sub-arrays with a distinct address. Banks are typically arranged in a memory such that different banks can have different row addresses activated at the same time. Within a bank, only one row address can be activated at a time. All column operations (read and writes) are pipelined such that only one bank can be accessed for any given cycle.

Sub-array:—A distinct group of memory cells, composed of many rows and columns, the size of which is determined based on what is reasonable for speed and power requirements for the given cycle.

Sense-Amplifier (Sense-Amp) Band:—A sense amplifier interfaces to each column of a sub-array. Each sense-amplifier senses the complementary bit and /bit differential when a row in that sub-array is activated for possible future reading purposes. All the sense-amplifiers stacked together for a sub-array comprise a sense-amplifier band. Sense-amplifiers are typically bi-directional, having the ability to connect to the columns in the sub-array on each side of it, therefore one sense-amplifier band typically divides two sub-arrays.

I/O pins:—The point of the memory device design that actually communicates data to the network outside the chip itself and sometimes denominated as the DQ pins. These pins drive data in (I) when writing and drive data out when reading. (O).

Chip Datapath (Data Bus):—The data lines that connect the banks to the I/O pins. There is at least one line per I/O pin, but there can be up to eight per I/O pin as the bank must pre-fetch 8 bits for each read command.

F-lines: Within the bank the datalines connecting the sense-amplifiers to the main amplifiers are referred to as "F-Lines". There is a F and /F for each dataline in the bank.

Y-select: The column select line. Based on the decoded column address that was input to the device for a read or write operation.

Spare Y (Spare Column Select):—A redundant column to be fuse programmable for the replacement of defective columns in the memory arrays.

In accordance with the present invention disclosed herein, a memory block in a memory device is effectively divided into two or more banks, and between these banks an additional non-shared sense amplifier band is added. The additional sense amplifier band is not shared by the banks as a sense amplifier cannot be shared across a bank boundary. Within this two or more bank block, separate data paths are provided for the two banks with the Y-Select lines being common. Therefore, if a Y address to Bank A is selected, the I/O lines to the adjoining Bank B will not be sensed and remain in a "masked" state.

In accordance with a more detailed implementation of the present invention as disclosed herein, the spare Y select lines may be separate for each of the split bank halves (or parts). Certain designs allow for the spare Y address to be flexibly set based upon the particular banks row address. As the two banks would almost certainly present differing row addresses, having separate spare Y select lines per bank allows for maximum flexibility. The spare Y select lines for bank A and B may connect to each of the sense-amplifier bands for hierarchical layout reasons. However, they are only activated if a spare Y address is selected only for the assigned bank.

The present invention further allows the control of the datapath to be simplified because any one given I/O only leads in a single direction from the device pin to all of the banks with which it needs to communicate. Moreover, the resulting datapath for any given I/O is generally shorter than that afforded by other conventional architectures which naturally provides greater speed.

Particularly disclosed herein is an integrated circuit device comprising a memory array including at least one memory block with the memory block comprising at least two memory banks. The memory banks have intermediate non-shared sense amplifiers therebetween; and a column decoder band associated with the memory block and coupled to a number of I/O pads of the device by a datapath. In a more particular embodiment, the integrated circuit device further comprises a memory array having two memory blocks with each of the two memory blocks comprising at least two of the memory banks and the column decoder band being associated with both of the memory blocks.

Also particularly disclosed herein is an integrated circuit device which comprises a plurality of memory blocks, each of the memory blocks comprising at least two memory banks. A non-shared sense amplifier band is located intermediate the memory banks in each of said memory blocks and a first column decoder band is located intermediate and operatively coupled to at least two of the plurality of memory blocks while a second column decoder band is located intermediate and operatively coupled to at least two others of the plurality of memory blocks. A first datapath couples the first column decoder band to first I/O pads of the device while a second datapath couples the second column decoder band to second I/O pads.

Still further disclosed herein is an integrated circuit device which comprises a plurality of first memory blocks, each of the first memory blocks comprising at least two memory banks having a non-shared sense amplifier band therebetween, and a plurality of second memory blocks, each of the second memory blocks comprising at least two memory banks having a non-shared sense amplifier band therebetween. A first column decoder band is operatively associated with pairs of the first plurality of memory blocks and a second column decoder band is operatively associated with pairs of the second plurality of memory blocks. A first datapath operatively couples the first column decoder band to first device I/O pads and a second data path operatively couples the second column decoder band to second device I/O pads.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a functional block diagram of a memory device implementing a conventional multi-bank block architecture wherein each bank of the memory array comprises one contiguous block of sub-arrays, with each bank of the array being divided by a column decoder region;

FIG. 2 is a further functional block diagram of a memory device implementing an alternative conventional multi-bank block architecture wherein each bank of the memory array is divided into smaller groups of contiguous sub-arrays but each block remains divided by a column decoder region;

DESCRIPTION OF A REPRESENTATIVE EMBODIMENT

Figure 3:
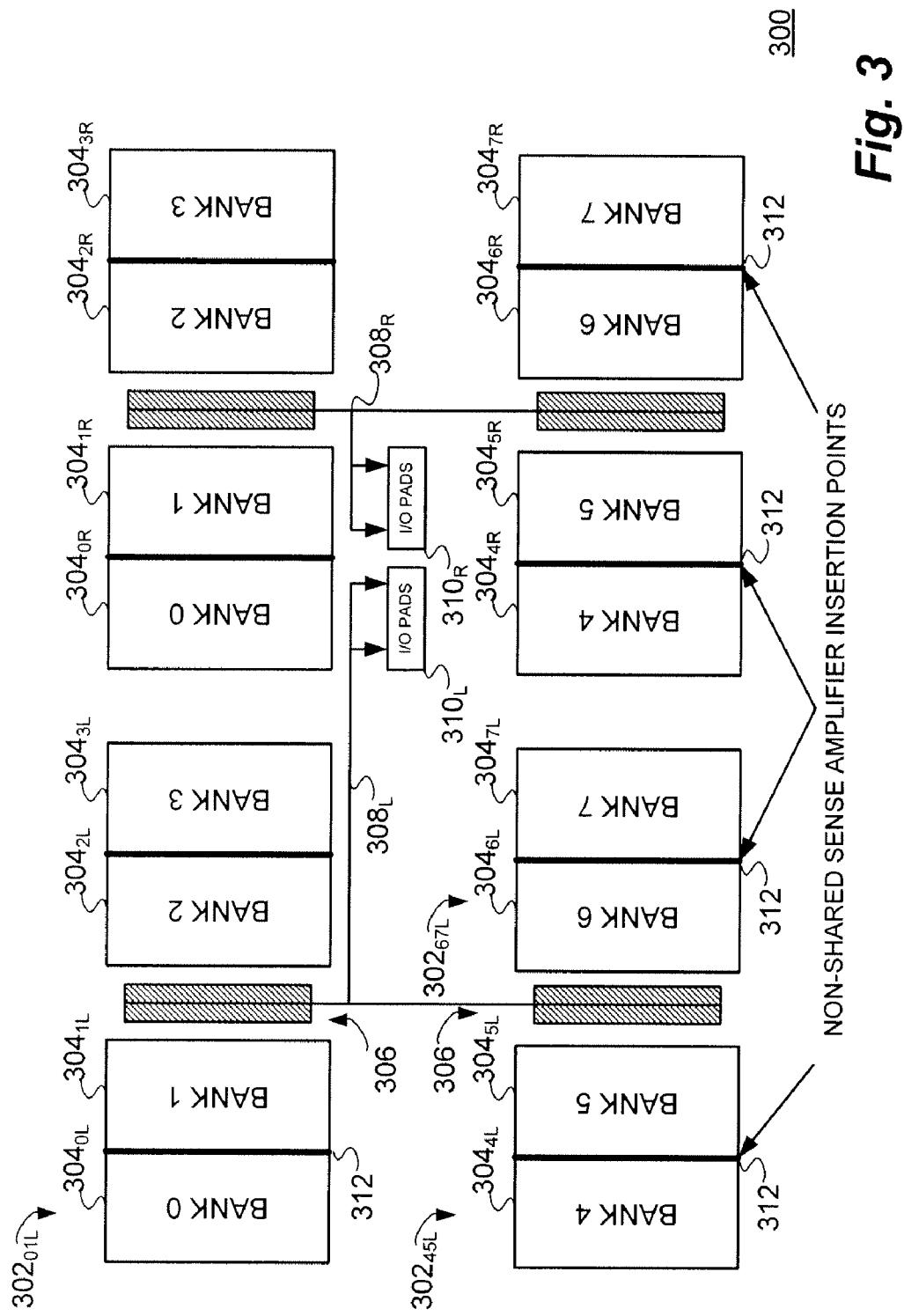
FIG. 3 is a representative functional block diagram of a memory device implementing the multi-bank block architecture for integrated circuit memory devices of the present invention illustrating two or more of the banks arranged as contiguous groups of sub-arrays and having non-shared sense amplifiers therebetween.

With reference now to FIG. 1, a functional block diagram of a memory device 100 implementing a conventional multi-bank block architecture is shown wherein each bank of the memory array comprises one contiguous block of sub-arrays, with each bank of the array being divided by a column decoder region.

In the typical architecture shown, the memory device 100 comprises memory cells organized into eight banks $102_0$ through $102_7$ (Banks 0 through Banks 7 inclusive). As shown, adjacent banks 102 are separated by intermediate column decoder regions 104, all coupled to a common datapath 106 to the memory device 100 I/O pads 108.

Each bank 102 is made up of a contiguous block of sub-arrays. A primary deficiency with this architecture is that the datapath 106 for any given I/O becomes very long, as it must connect to each bank 102. This is especially true in the case of having all the I/O pins grouped in the center of the die. In fact, this particular pin arrangement is mandated by many Joint Electron Device Engineering Council (JEDEC) standard pinout diagrams. Control of the datapath 106 is also complicated by the fact that data into and out of the I/O pins must be directed in two directions, i.e. to the banks on the left half (Banks 0:3) as well as to the banks on the right half (Banks 4:7).

With reference additionally now to FIG. 2, a further functional block diagram of a memory device 200 implementing an alternative conventional multi-bank block architecture is shown wherein each bank of the memory array is divided into smaller groups of contiguous sub-arrays but each block remains divided by a column decoder region.

In the alternative architecture shown, the memory device 200 comprises memory cells organized into two eight bank groupings $202_{0L}$ through $202_{7L}$ (leftmost Banks 0 through Banks 7 inclusive) and $202_{0R}$ through $202_{7R}$ (rightmost Banks 0 through Banks 7 inclusive). As in the preceding figure, adjacent banks 202 are separated by intermediate column decoder regions 204. The column decoder regions 204 associated with banks $202_{0L}$ through $202_{7L}$ are coupled by a data path $206_L$ to I/O pads $208_L$ while the column decoder regions 204 associated with banks $202_{0R}$ through $202_{7R}$ are coupled by a data path $206_R$ to separate I/O pads $208_R$.

Each of the banks 202 is divided into smaller groups of contiguous sub-arrays, but each bank 202 is still separated from an adjoining bank 202 by a column decoder region 204. That is, the Y-select lines from the column decoder, and the internal data lines for any given bank 202, are unique for each bank and they do not overlap. Utilizing this architecture, the datapath 206 is slightly simplified as compared to that of the preceding figure inasmuch as from an I/O pin location the datapath 206 is directed in only a single direction. However, the resulting datapaths 206 are not much shorter and significant die area is added through the inclusion of the additional column decoder regions 204.

With reference additionally now to FIG. 3, a representative functional block diagram of a memory device 300 is shown implementing the multi-bank block architecture for integrated circuit memory devices of the present invention and illustrating two or more of the banks arranged as contiguous groups of sub-arrays and having non-shared sense amplifiers therebetween.

The memory device 300 comprises memory cells organized into eight two-bank blocks, the leftmost blocks indicated as $302_{01L}$, $302_{23L}$, $302_{45L}$ etc. and the rightmost blocks indicated as $302_{01R}$, $302_{23R}$, $302_{45R}$ etc. For example, block $302_{01L}$ comprises banks $304_{0L}$ and $304_{1L}$ (leftmost Bank 0 and Bank 1) while block $302_{01R}$ comprises banks $304_{0R}$ and $304_{1R}$ (rightmost Bank 0 and Bank 1) etc. Blocks $302_{01L}$ and $302_{23L}$ are separated by one column decoder region 306 while blocks $302_{45L}$ and $302_{67L}$ are separated by another column decoder region 306. Similarly, blocks $302_{01R}$ and $302_{23R}$ are separated by one column decoder region 306 while blocks $302_{45R}$ and $302_{67R}$ are separated by another column decoder region 306.

The column decoder regions 306 associated with blocks $302_{01L}$ through $302_{67L}$ are coupled by a data path $308_L$ to I/O pads $310_L$ while the column decoder regions 306 associated with blocks $302_{01R}$ through $302_{67R}$ are coupled by a data path $308_R$ to separate I/O pads $310_R$. Each of the associated banks 304 of each block 302 are separated by non-shared sense amplifier bands 312 as will be more fully described with respect to the succeeding figure.

Figure 4:
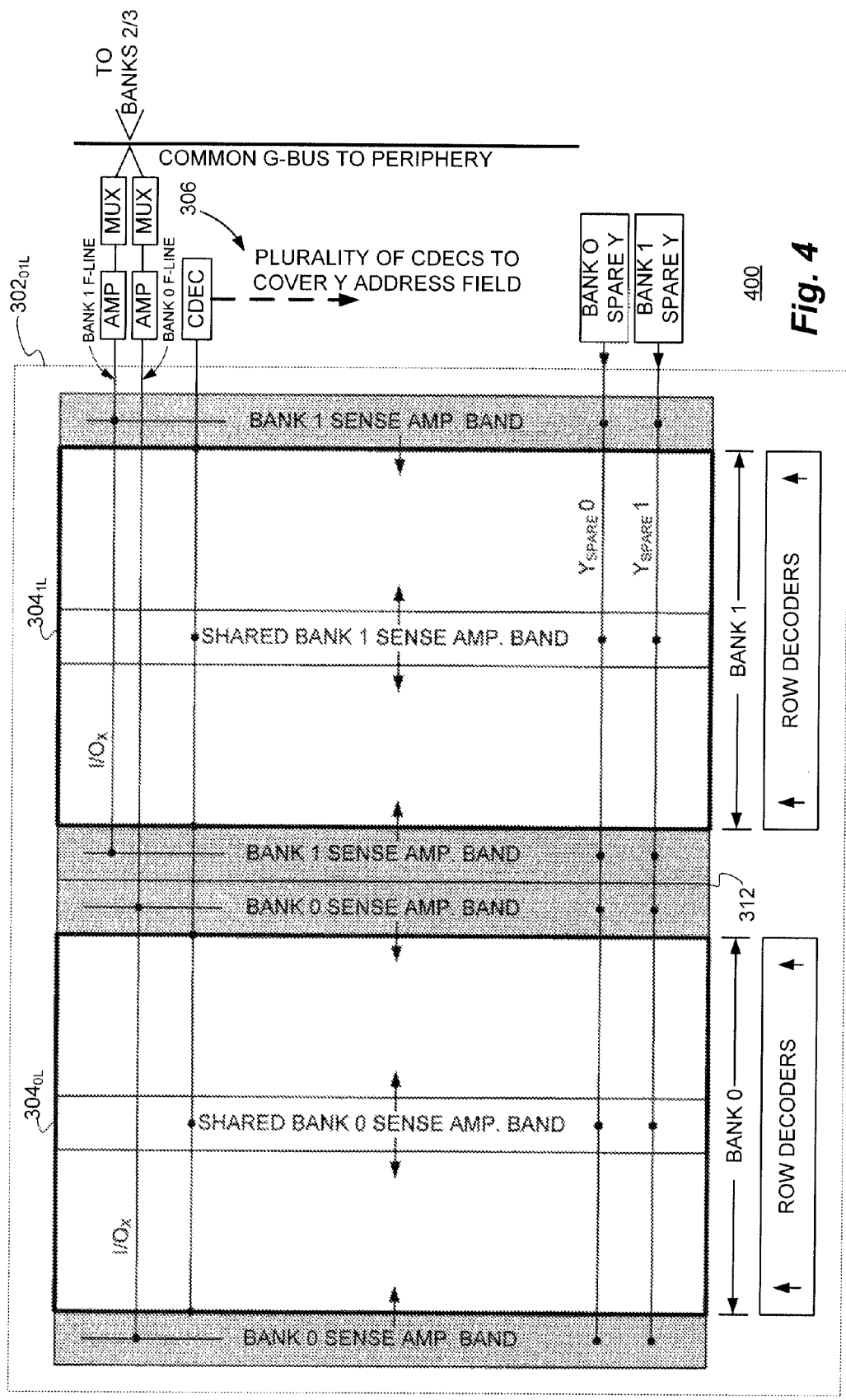
FIG. 4 is a more detailed view of a portion of the preceding figure illustrating the leftmost Bank 0 and adjacent Bank 1 inclusive of detail as to the intra-bank sense amplifier band and non-shared inter-bank sense amplifier band.

With reference additionally now to FIG. 4, a more detailed view of a portion 400 of the preceding figure is shown illustrating the block $302_{01L}$ comprising leftmost bank $304_{0L}$ (Bank 0) and adjacent bank $304_{1L}$ (Bank 1) and further inclusive of detail as to the centrally located intra-bank sense amplifier band and non-shared inter-bank sense amplifier band 312.

As illustrated, two (or more) memory banks 304 are arranged as contiguous groups of sub-arrays, denominated as a multi-bank block 302 with the following characteristics. At the sub-array boundary between banks 302, the sense-amplifiers cannot be shared, so an extra sense-amplifier band 312 is inserted at these locations. The Y-select lines are shared by all sense-amp bands in the multi-bank block 302. This eliminates the need for adding a separate group of column decoders between each bank 304. In this arrangement all the banks 304 and their associated sub-arrays share a column decoder region 306 and its Y-select lines.

The datalines ($I/O_X$) crossing the multi-bank block 302 are not shared and are, in fact, unique to each bank 304. Amplifiers and drivers typically placed in the column decoder region 306 for interfacing the bank 304 data with the main chip datapath are unique for each bank 304 and are not shared with a multi-bank block.

When performing a read operation, a Y-select line common to the whole block 302 will be activated, but only data from one bank 304 is actually desired. Control logic is then provided so the passing of data for only the bank 304 addressed for that particular operation is carried out. Data for any banks 304 in an "active" state to which the Y-select also connects must either be sensed and ignored, or maintained in an equalization state and not sensed at all. If the undesired banks 304 are in a "precharge" state, there is no issue as those sense-amplifiers are already in a state so as not to conflict with the desired data from the desired bank 304. Care should be taken to control the external timing such that the Y-select accesses (read or write operations) to one bank 304 are not performed at the exact time an adjacent bank 304 is undertaking its initial wordline sensing (activation).

On the other hand, write operations are perhaps more critical. As in reading, a common Y-select line will be coupled to several possible active sense-amplifier bands, but only the desired bank 304 can actually be written to. This may be accomplished by only driving the datalines associated with that bank 304. The other datalines may then be held in a precharge and/or "mask" state so the sense-amplifier will not be written to even though its Y-select line is activated. (The datalines within a bank 304 are typically a complementary pair, (true and /true) and keeping both lines in a logic "high" state is a well known method of masking (i.e. not changing) the data state of whatever is currently latched in the sense-amplifier.

Also contemplated is the possible provision of spare column lines that are physically common with each multi-bank block 302, but only assigned electronically to one particular bank 304. This allows the spare columns to be programmed uniquely for the banks 304 to which they are assigned thereby allowing more flexibility in the assignment of spares.

While there have been described above the principles of the present invention in conjunction with a specific memory device architecture, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device comprising:
   a memory array including at least one memory block, said memory block comprising at least two memory banks, said memory banks having intermediate non-shared sense amplifiers therebetween; and
   a plurality of column decoder bands associated with said memory block and coupled to a number of I/O pads of said device by a datapath,
   wherein said memory array comprises:
   at least a left-side first memory block and at least a right-side second memory block, said first and second memory blocks comprising at least two of said memory banks;
   a first of said column decoder bands associated with said first memory block and coupled to a first number of I/O pads by a first datapath; and
   a second of said column decoder bands associated with said second memory block and coupled to a second number of I/O pads by a second datapath.

2. The integrated circuit of claim 1 wherein said at least two memory banks have common Y-select lines.

3. The integrated circuit device of claim 1 wherein at least said first datapath crosses over at least one of said memory banks of said first memory block.

4. The integrated circuit device of claim 3 wherein at least said first datapath crosses over another left-side memory block.

5. An integrated circuit device comprising:
- a plurality of memory blocks, each of said memory blocks comprising at least two memory banks;
- a non-shared sense amplifier band intermediate said memory banks in each of said memory blocks;
- a first column decoder band intermediate and operatively coupled to at least two of said plurality of memory blocks and a second column decoder band intermediate and operatively coupled to at least two others of said plurality of memory blocks; and
- a first datapath coupling said first column decoder band to first I/O pads of said device and a second datapath coupling said second column decoder band to second I/O pads of said device.

6. The integrated circuit device of claim 5 wherein said at least two memory banks in each of said plurality of memory blocks have common Y-select lines operatively associated with corresponding ones of said first and second said column decoder bands.

7. The integrated circuit device of claim 5 wherein said first datapath crosses over at least one of said memory banks of said at least two of said plurality of memory blocks.

8. The integrated circuit device of claim 7 wherein said first datapath crosses over another of said at least two of said plurality of memory blocks without coupling thereto.

9. The integrated circuit device of claim 5 wherein each of said at least two memory banks in said plurality of memory blocks includes shared spare column select lines addressably assigned to only one of said at least two memory banks.

10. The integrated circuit device of claim 5 further comprising:
- a column address selection circuit for activation of a column address select line within at least one of said plurality of memory blocks based on more than one of said at least two memory bank addresses.

11. The integrated circuit device of claim 5 further comprising:
- write circuitry for writing data to only one of said at least two memory banks within a memory block on one bank address.

12. The integrated circuit device of claim 5 further comprising:
- read circuitry for reading data from only one of said plurality of memory blocks to an associated one of said first and second datapaths based on one bank address.

13. An integrated circuit device comprising:
- a plurality of first memory blocks, each of said first memory blocks comprising at least two memory banks having a non-shared sense amplifier band therebetween;
- a plurality of second memory blocks, each of said second memory blocks comprising at least two memory banks having a non-shared sense amplifier band therebetween;
- a first column decoder band operatively associated with pairs of said first plurality of memory blocks and a second column decoder band operatively associated with pairs of said second plurality of memory blocks; and
- a first datapath operatively coupling said first column decoder band to first device I/O pads and a second data path operatively coupling said second column decoder band to second device I/O pads.

14. The integrated circuit device of claim 13 further comprising:
- common Y-select lines associated with each of said at least two memory banks in each of said first and second memory blocks derived from corresponding ones of said first and second column decoder bands.

15. The integrated circuit device of claim 13 wherein at least portions of said first datapath cross over another of said first memory blocks without coupling thereto.

16. The integrated circuit device of claim 13 wherein each of said at least two memory banks in said plurality of first and second memory blocks includes shared spare column select lines addressably assigned to only one of said at least two memory banks.

17. The integrated circuit device of claim 13 further comprising:
- a column address selection circuit for activation of a column address select line within at least one of said plurality of first and second memory blocks based on more than one of said at least two memory bank addresses.

18. The integrated circuit device of claim 13 further comprising:
- write circuitry for writing data to only one of said at least two memory banks within a memory block on one bank address.

19. The integrated circuit device of claim 13 further comprising:
- read circuitry for reading data from only one of said plurality of first and second memory blocks to an associated one of said first and second datapaths based on one bank address.

* * * * *